United States Patent [19]

Fujii et al.

[11] Patent Number: 5,016,207

[45] Date of Patent: May 14, 1991

[54] HIGH-SPEED DIGITAL FILTER PROCESSOR INCLUDING PARALLEL PATHS FOR PROCESSING DATA, SUITABLE FOR USE IN SPATIAL FILTER IMAGE PROCESSING

[75] Inventors: Tatsuya Fujii, Nishinomiya; Yutaka Sato, Settsu; Masafumi Tanaka, Osaka, all of Japan

[73] Assignee: Ricoh Company, Ltd., Japan

[21] Appl. No.: 503,424

[22] Filed: Apr. 3, 1990

Related U.S. Application Data

[63] Continuation-in-part of Ser. No. 336,460, Apr. 10, 1989, abandoned.

[30] Foreign Application Priority Data

Apr. 20, 1988 [JP] Japan .................................. 63-98852

[51] Int. Cl.$^5$ ............................................. G06F 15/31
[52] U.S. Cl. ........................... 364/724.01; 364/724.13
[58] Field of Search ....................... 364/724.01, 724.05, 364/724.10, 724.13, 724.15, 724.16

[56] References Cited

U.S. PATENT DOCUMENTS

| | | | |
|---|---|---|---|
| 4,623,980 | 11/1986 | Vary | 364/724.10 |
| 4,725,972 | 2/1988 | Göckler | 364/724.10 |
| 4,777,612 | 10/1988 | Tomimitusu | 364/724.13 |
| 4,811,263 | 3/1989 | Hedley et al. | 364/724.13 |
| 4,821,223 | 4/1989 | David | 364/724.13 |

Primary Examiner—Gary V. Harkcom
Assistant Examiner—Long T. Nguyen
Attorney, Agent, or Firm—Mason, Fenwick & Lawrence

[57] ABSTRACT

A digital filter processor includes an input part for distributing an input digital data train including a plurality of digital data to a plurality of systems. Each of the systems is provided with a corresopnding one of the distributed data trains at the same time. Each of the systems includes an operation part for multiplying each digital data included in the corresponding one of the distributed data trains by a corresponding multiplication factor at the same time to thereby generate multiplied data and for generating a sum signal indicative of a sum total of the multiplied data related to the corresponding one of the distributed data trains, each of the systems outputting the sum signal at the same time. The operation part also includes a selection part for selecting one of the sum signals supplied from the operation parts provided for the plurality of systems and for outputting an output digital signal.

34 Claims, 8 Drawing Sheets

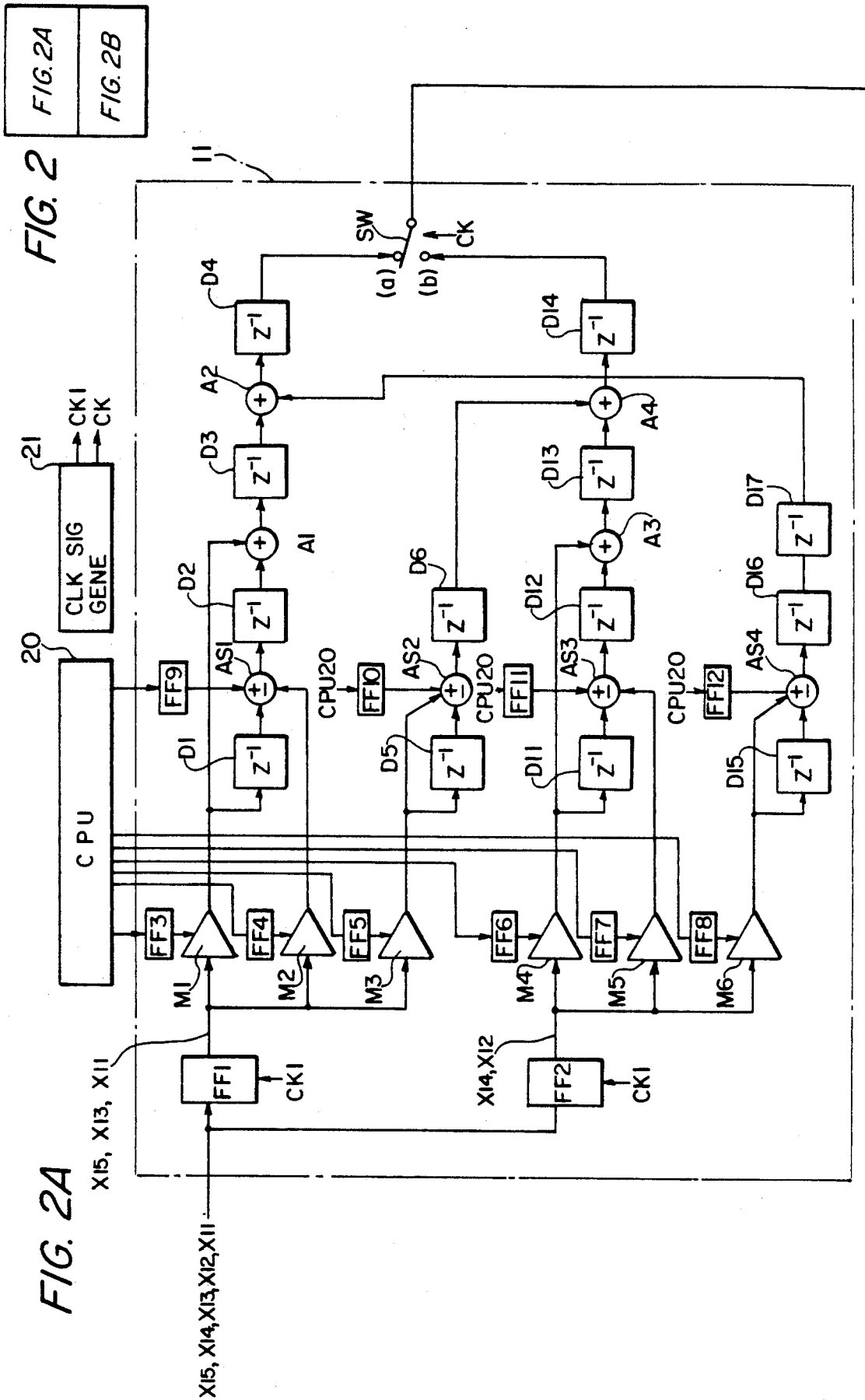

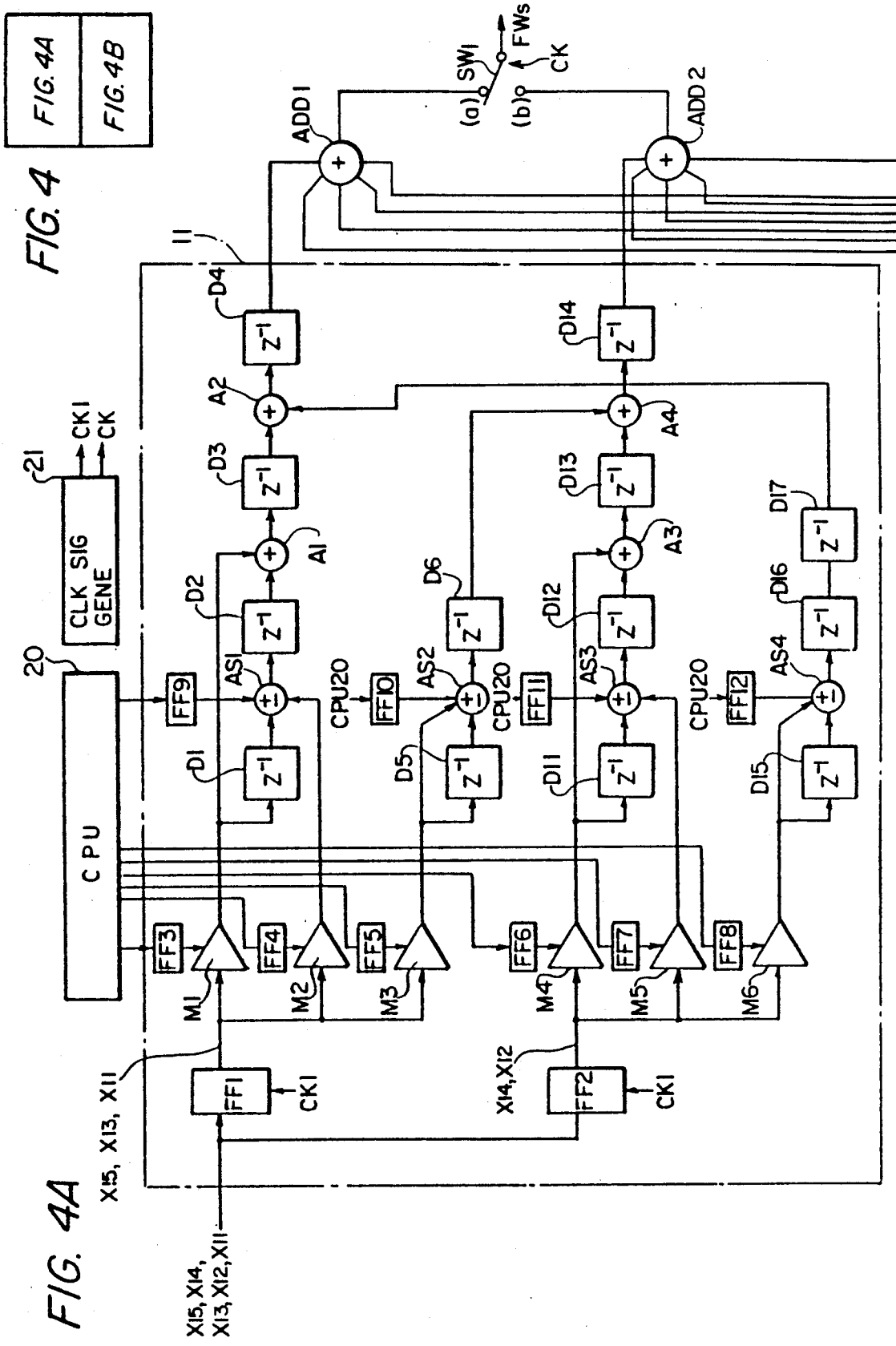

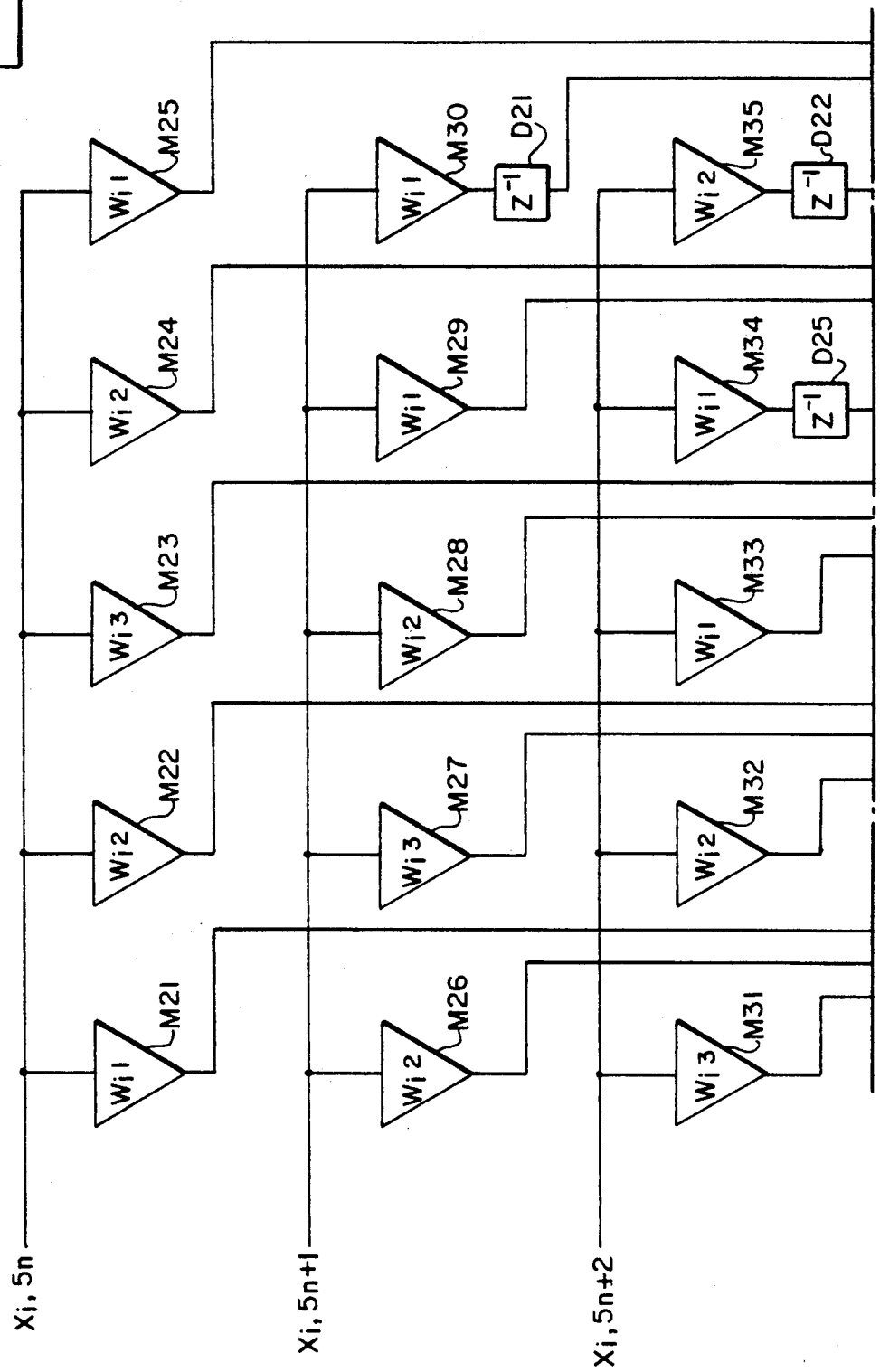

HIGH-SPEED DIGITAL FILTER PROCESSOR INCLUDING PARALLEL PATHS FOR PROCESSING DATA, SUITABLE FOR USE IN SPATIAL FILTER IMAGE PROCESSING

CROSS-REFERENCE TO RELATED APPLICATION

This application is a continuation-in-part of application Ser. No. 336,460, filed Apr. 10, 1989 for DIGITAL FILTER PROCESSOR, abandoned.

BACKGROUND OF THE INVENTION

The present invention generally relates to a digital filter processor, and more particularly to a spacial filter having a finite impulse response filter.

Conventionally, spacial filter image processing is employed for smoothing, edge extraction, edge emphasizing and the like in a digital copying machine, facsimile machine, scanner and so on. In spacial filter image processing with respect to pixels arranged in n rows and n columns, a window of image is set which consists of 5×5 pixels having as the center a pixel A which is one of the 5 ×5 pixels. Then, a corresponding filter factor is multiplied by each of the 5×5 image data of the window. Finally, the sum total of the multiplied image data is calculated. The sum total is data obtained by subjecting the pixel A to the spacial filter image process. Image data relating to each pixel is 6-bit image data capable of representing 64 tone levels.

For example, when an image matrix X which consists of 5×5 pixels xij is represented by formula (1), $$X = \begin{pmatrix} X11 & X12 & X13 & X14 & X15 \\ X21 & X22 & X23 & X24 & X25 \\ X31 & X32 & X33 & X34 & X35 \\ X41 & X42 & X43 & X44 & X45 \\ X51 & X52 & X53 & X54 & X55 \end{pmatrix} \quad (1)$$

and when a filter factor matrix W consisting of 5×5 filter factors Wij is represented by formula (2), $$W = \begin{pmatrix} W11 & W12 & W13 & W14 & W15 \\ W21 & W22 & W23 & W24 & W25 \\ W31 & W32 & W33 & W34 & W35 \\ W41 & W42 & W43 & W44 & W45 \\ W51 & W52 & W53 & W54 & W55 \end{pmatrix} \quad (2)$$

image data FW obtained after spacial filter image processing is represented as follows:

$$\begin{aligned} FW = \ & W11X11 + W12X12 + W13X13 \\ & + W14X14 + W15X15 \\ & + W21X21 + W22X22 + W23X23 \\ & + W24X24 + W25X25 \\ & + W31X31 + W32X32 + W33X33 \\ & + W34X34 + W35X35 \end{aligned}$$

FIG.1 is a block diagram of a spacial filter image processing device which implements spacial filter image processing with a 5×5 filter factor matrix W with respect to a 5×5 image matrix X. Referring to FIG.1, the spacial filter image processing device includes processing circuits 51 through 55, which perform an image processing for image data amounting to one line. Image data X11, X12, X13, X14 and X15 relating to pixels are supplied to multipliers M11, M12, M13, M14 and M15 of a processing circuit 51 in this order in accordance with the period of a predetermined clock signal. The multipliers M11, M12, M13, M14 and M15 have multiplication factors W11, W12, W13, W14 and W15, respectively. The multiplication result of the multiplier M11 is supplied to a register D11. The multiplication results supplied from the multipliers M12, M13, M14 and M15 are supplied to first input terminals of two-input adders A51, A52, A53 and A54, respectively. At this time, the register D51 temporarily stores the supplied data in accordance with the clock period, and supplies the stored data to the second input terminal of the adder A51. The adders A51 through A54 add the data at the first input terminals thereof and the data at the second input terminals, and supply the registers D52 through D55 with the addition results, respectively. In response to this operation, the registers D52 through D55 temporarily store the supplied data therein, and then supply the same with the adders A52, A53, A54, A55 and an adder ADD, respectively. The register D55 temporarily stores the supplied data with the clock period, and then outputs, as an output signal of the processing circuit 51, the stored data to a first input terminal of the adder ADD.

Each of the processing circuits 52 through 55 has the same structure as the processing circuit 51 except that they have corresponding multiplication factors. The processing circuits 52 through 55 subject image data X21 through X25, X31 through X35, X41 through X45, and X51 through X55 to an image filter process in the same way as the processing circuit 51. The operation results supplied from the processing circuits 52 through 55 are fed to the second through fifth input terminals of the adder ADD. The adder ADD adds all the data supplied through the first through fifth input terminals thereof, and outputs the image data FW which is the addition result.

For example, when a filter factor matrix Ws of a symmetrical image filtering process for an image is represented by the following formula, $$W = \begin{pmatrix} W11 & W12 & W13 & \pm W12 & \pm W11 \\ W21 & W22 & W23 & \pm W22 & \pm W21 \\ W31 & W32 & W33 & \pm W32 & \pm W31 \\ W41 & W42 & W43 & \pm W42 & \pm W41 \\ W51 & W52 & W53 & \pm W52 & \pm W51 \end{pmatrix} \quad (4)$$

an resultant image FWs of the spacial filter image process is represented as follows:

$$\begin{aligned} FW = \ & W11X11 + W12X12 + W13X13 \\ & \pm W12X14 \pm W11X15 \\ & + W21X21 + W22X22 + W23X23 \\ & \pm W22X24 \pm W21X25 \\ & + W31X31 + W32X32 + W33X33 \\ & \pm W32X34 \pm W31X35 \\ & + W41X41 + W42X42 + W43X43 \\ & \pm W42X44 \pm W41X45 \\ & + W11X11 + W52X52 + W53X53 \\ & \pm W52X54 \pm W51X55 \end{aligned} \quad (5)$$

However, in the above-mentioned conventional digital filter processors, 5 registers such as registers D51 through D55 are cascaded between the input and output terminals of the processing circuits 51 through 55. For this reason, it takes five times the aforementioned clock period to obtain the resultant of the spacial filter image process. Such a time is considerably long, and therefore it is necessary to reduce the processing time.

SUMMARY OF THE INVENTION

It is therefore a general object of the present invention to provide a digital filter processor in which the above-mentioned disadvantages are eliminated.

A more specific object of the present invention is to provide a higher-speed digital filter processor capable of carrying out spacial filter image process at increased speeds.

The above objects of the present invention can be achieved by a digital filter processor comprising input means for distributing an input digital data train consisting of a plurality of digital data to a plurality of systems, each of the systems being provided with a corresponding one of the distributed data trains at the same time; each of the systems including operation means for multiplying each digital data included in the corresponding one of the distributed data trains by a corresponding multiplication factor at the same time to thereby generate multiplied data and for generating a sum signal indicative of the sum total of the multiplied data related to the corresponding one of the distributed data trains, each of the systems outputting the sum signal at the same time; and selection means for selecting one of the sum signals supplied from the operation means provided for the plurality of systems and for outputting an output digital signal.

The above objects of the present invention can also be achieved by a digital filter processor for carrying out spacial filter image processing with respect to an image matrix X consisting of image data Xij arranged in n rows and n columns (n is an arbitrary integer), by using a filter factor matrix Wij which consists of factors Wij arranged in n rows and n columns where factors relating to columns other than the $[(n+1)/2]$-th column are symmetrical with respect to the $[(n+1)/2]$-th column, the digital filter processor comprising a plurality of processing circuits each receiving image data amounting to one row of the image matrix and outputting a first partial sum signal, and adder means for adding the first partial sum signals supplied from the plurality of processing circuits, thereby outputting a filtered image signal, each of the processing circuits comprising input means for distributing the image data Xij supplied for every row to m systems (m is an arbitrary integer), each of the systems including operation means for multiplying the distributed image data Xij by the corresponding factors Wij and for generating a second partial sum signal indicative of the sum total of all the multiplied data relating to the corresponding system; and selection means for selecting one of the second partial sum signals supplied from the operation means provided for the systems, the selected one of the second partial sum signals being supplied, as one of the first partial sum signals, to the adder means.

The above objects of the present invention can also be achieved by a digital filter processor for carrying out spacial filter image processing with respect to an image matrix X consisting of image data Xij arranged in n rows and n columns (n is an arbitrary integer), by using a filter factor matrix Wij which consists of factors Wij arranged in n rows and n columns where factors relating to columns other than the $[(n+1)/2]$-th column are symmetrical with respect to the $[(n+1)/2]$-th column, the digital filter processor comprising a plurality of processing circuits each receiving image data Xij amounting to one row and outputting m partial sum signals, each of the processing circuits comprising input means for distributing the image data Xij supplied for every row to m systems (m is an arbitrary integer), each of the systems including operation means for multiplying the distributed image data Xij by the corresponding factors Wij and for generating one of the m partial sum signals indicative of the sum total of all the multiplied data relating to the corresponding system; the digital filter processor further comprising adder means for separately adding the partial sum signals relating to the corresponding systems in each of the plurality of processing circuits, thereby generating m addition results; and selection means for selecting one of the m addition results supplied from the adder means and for generating a filtered image data which has been subjected to the spacial filter image processing.

Other objects, features and advantages of the present invention will become apparent from the following detailed description when read in conjunction with the accompanying drawings.

BRIEF DESCRIPTION OF THE DRAWINGS

FIG. 2 is a block diagram showing how to combine FIGS. 2A and 2B;

FIGS. 2A and 2B are block diagrams of a preferred embodiment of the present invention;

FIG. 4 is a block diagram showing how to combine FIGS. 4A and 4B;

FIGS. 4A and 4B are block diagrams of a variation of the embodiment of FIG. 2; and FIG. 5 is a block diagram showing how to combine FIGS. 5A and 5B; and.

FIGS. 5A and 5B are block diagrams of another preferred embodiment of the present invention.

DESCRIPTION OF THE PREFERRED EMBODIMENTS

Figure 1:
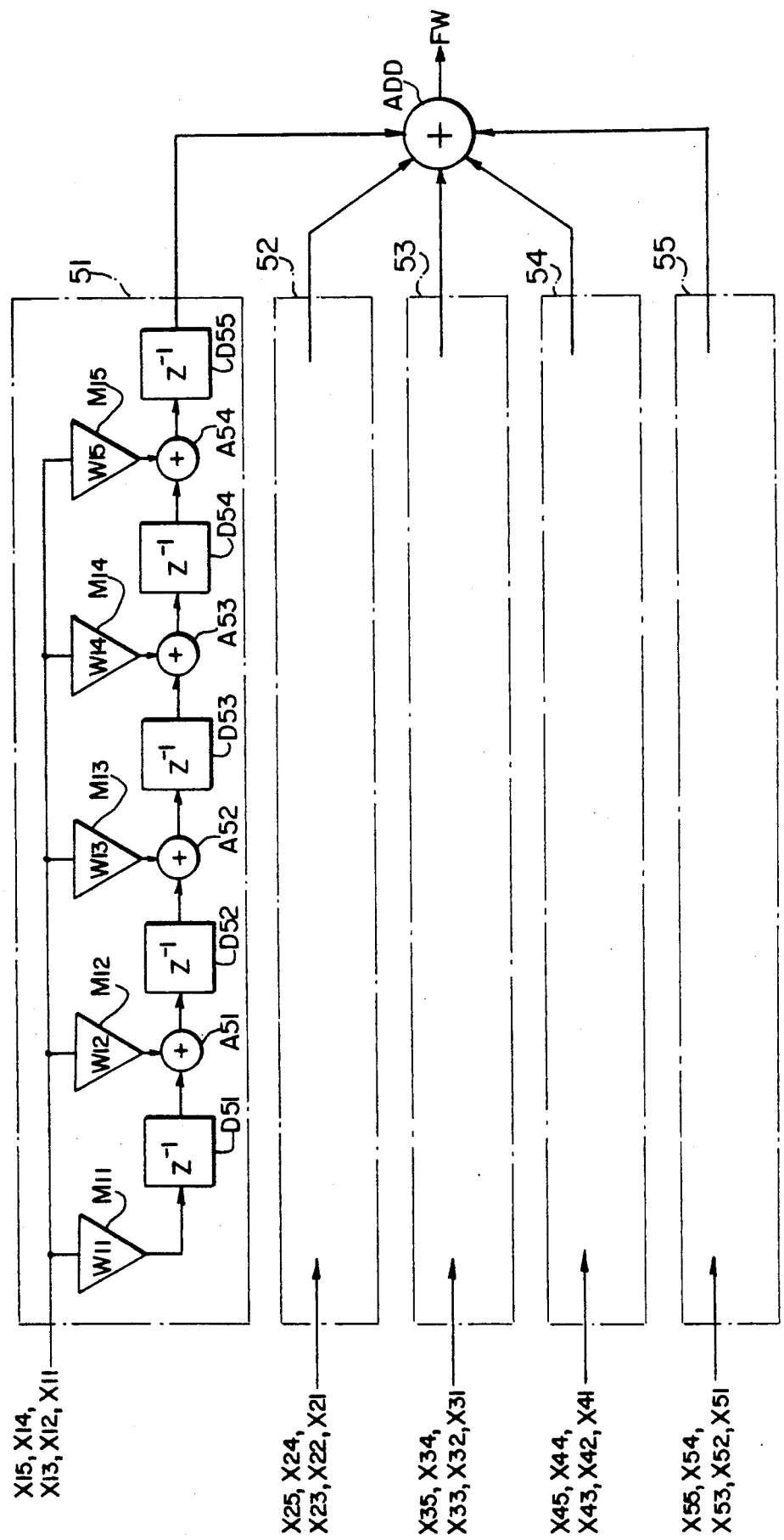
FIG. 1 is a block diagram of a conventional spacial filter image processing device.

A description will now be given of a preferred embodiment of the present invention with reference to FIGS. 2A and 2B, in which those parts which are the same as those in FIG. 1 are given the same references.

The illustrated embodiment is a spacial filter image processing device, and includes five processing circuits 11 through 15 which perform the spacial filter image process with the filter factor matrix W which consists of $5 \times 5$ factors with respect to the image matrix X consisting of $5 \times 5$ pixels. The processing circuits 11 through 15 have the same structure, and therefore a detailed structure of only the processing circuit 11 is depicted in FIG. 2A. Each processing circuit is a finite impulse response filter.

Figure 2B:
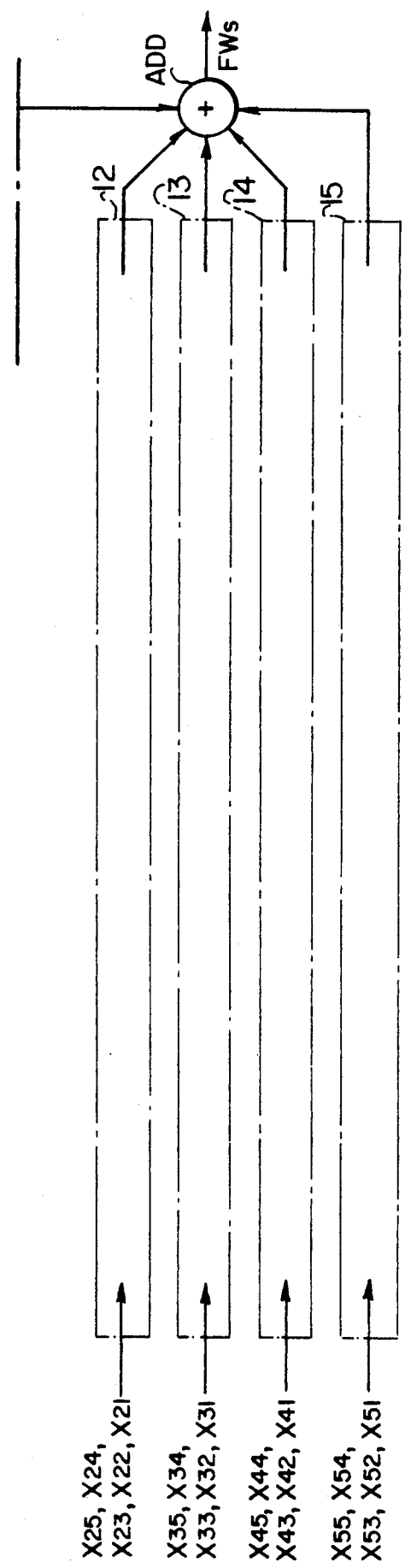

The embodiment of FIGS. 2A and 2B has the following features. Consecutive image data X11, X12, X13, X14 and X15 are supplied to flip-flops FF1 and FF2, which have the same storing timing. The data train of consecutive image data X11, X12, X13, X14 and X15 is divided into two data trains, one of which consists of image data X11, X13 and X15, the other consisting of image data X12, X14 and X16. It is noted that X16 subsequent to X15 is not concerned with the matrix defined by formula (1). In other words, the consecutive image data are distributed to two systems by the flip-flops FF1 and FF2. Further, the number of registers cascaded between input and output terminals of each of the processing circuits 11 through 15 is reduced to 4.

Figure 3:
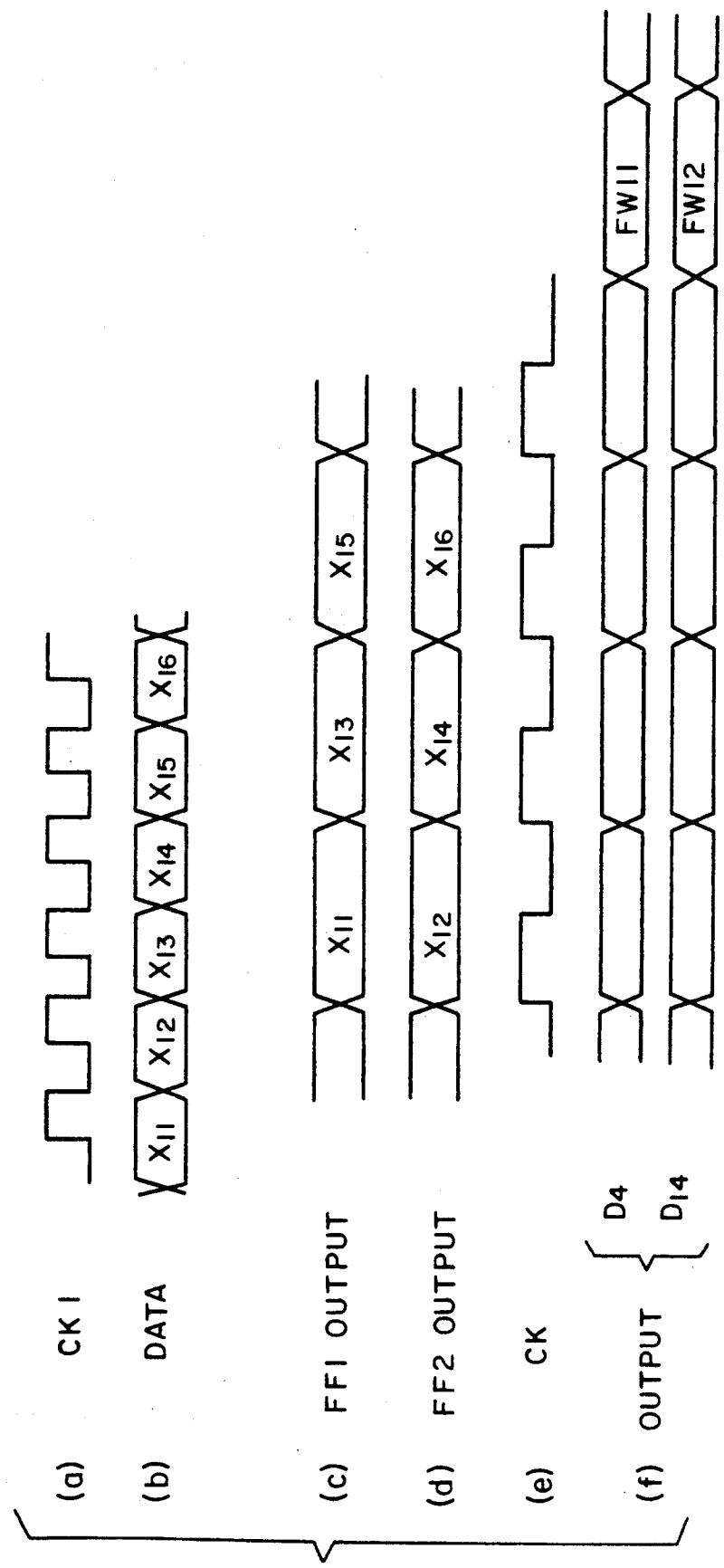
FIG. 3 is a view illustrating clock signals used in the embodiment.

The image data X11, X12, X13, X14 and X15 in the first row of the image matrix X defined by the formula (1) are alternately supplied to the flip-flops FF1 and FF2 with the period of a clock signal CK1, which is generated by a clock signal generator 21. The clock signal CK1 is illustrated in FIG. 3. The flip-flops FF1 and FF2 operate in synchronism with clock signal CK1. The flip-flops FF1 and FF2 temporarily store and output the incoming data in synchronism with the rise of the clock signal CK1. As shown in FIG. 3(c) and FIG. 3(d), the output data successively supplied from the flip-flop FF1 is supplied to multipliers M1, M2 and M3 in synchronism with the clock signal CK1, and the output data successively supplied from the flip-flop FF2 is supplied to multipliers M4, M5 and M6 in synchronism with the clock signal CK1.

Elements provided between the flip-flops FF1 and FF2 and a switch SW operate in synchronism with a clock signal CK, which is generated by the clock signal generator 21.

Before executing the spacial filter image process, filter factors W11, W13, W12, W11, W13 and W12 relating to the first row of the filter factor matrix Ws defined by the formula (4) are supplied, as multiplication factors, to the multipliers M1, M2, M3, M4, M5 and M6, respectively. These filter factors are generated by a central processing unit 20 (hereafter simply referred to as a CPU), and are temporarily stored in corresponding flip-flops FF3 through FF8 associated with the multipliers M1 through M6, respectively. The multipliers M1, M2 and M3 multiply the corresponding image data by the multiplication factors W11, W13 and W12, respectively. The multipliers M4, M5 and M6 multiply the corresponding image data by the multiplication factors W11, W13 and W12, respectively.

The multiplication result from the multiplier M1 is supplied to a register D1 and a first input terminal of an adder A1. The multiplication result from the multiplier M2 is supplied to a second input terminal of an adder-subtracter AS1. The multiplication result from the multiplier M3 is supplied to a register D5 and a first input terminal of an adder-subtracter AS2. The multiplication result from the multiplier M4 is supplied to a register D11 and a first input terminal of an adder A3. The multiplication result from the multiplier M5 is supplied to a first input terminal of an adder-subtracter AS3. The multiplication result from the multiplier M6 is supplied to a register D15 and a first input terminal of an adder-subtracter AS4.

Registers D1 through D6 and D11 through D17 input, in synchronism with the rise of the clock signal CK, the corresponding data, which is supplied with the period of the clock signal CK, and store the same temporarily. The registers D1-D6 and D11-D17 function as unit delay elements.

The CPU 20 writes data which indicate the sign of "+" or "−" relating to the data into the fourth and fifth columns of the formula (4) in flip-flops FF9 through FF12. Then, the sign data stored in the flip-flops FF9 through FF12 are transferred to the adder-subtracters AS1 through AS4, respectively. The output data of the register D1 is supplied to a second input terminal of the adder-subtracter AS1. The adder-subtracter AS1 executes addition or subtraction with respect to the data supplied to the first and second input terminals thereof, depending on the sign data supplied from the flip-flop FF9. The operation result is supplied to a second input terminal of the adder A1 through the register D2. The adder A1 adds the data supplied to the first and second input terminals thereof, and outputs the resultant to a first input terminal of an adder A2 through the register D3. The adder A2 adds the data supplied to the first and second input terminals thereof, and outputs the addition result (FW11 shown in FIG. 3(f)) to an (a) terminal of the switch SW through the register D4.

The data supplied from the register D5 is supplied to a second input terminal of the adder-subtracter AS2. The adder-subtracter AS2 executes addition or subtraction with respect to the data supplied to the first and second input terminals thereof, depending on the sign data supplied from the flip-flop FF10. The operation result in the adder-subtracter AS2 is supplied to a first input terminal of an adder A4 through the register D6.

The data output from the register D11 is supplied to a second input terminal of the adder-subtracter AS3. The adder-subtracter AS3 executes addition or subtraction with respect to the data supplied from the first and second input terminals thereof, depending on the sign data supplied from the flip-flop FF11. The operation result in the adder-subtracter AS3 is supplied to a second input terminal of the adder A3 through the register D12. The adder A3 adds the data supplied to the first and second input terminals thereof, and outputs the addition result to a second input terminal of the adder A4. The adder A4 adds the data supplied to the first and second input terminals thereof, and outputs the addition result (FW12 shown in FIG. 3(f)) to a (b) terminal of the switch SW through the register D14.

The output data of the register D15 is supplied to the second input terminal of the adder-subtracter AS4. The adder-subtracter AS4 executes addition or subtraction with respect to the data supplied to the first and second input terminals thereof. The operation result derived from the adder-subtracter AS4 is supplied to the second input terminal of the adder A2 through the registers D16 and D17.

The switch SW alternately and repetitively selects one of the (a) and (b) terminals in synchronism with the clock signal CK1 shown in FIG. 3(a). The selected data is then applied to the first input terminal of the adder ADD. The switch SW selects the (a) terminal when the clock signal CK1 is maintained at a high level, and selects the (b) terminal when the clock signal CK1 is maintained at a low level. As a result, in synchronism with the clock signal CK1, the resultant data from the spacial filter image process for the image data X11 through X15 is output from the register D4 through the (a) terminal of the switch SW and is then output from the register D14 through the (b) terminal of the switch SW.

The processing circuit 11 thus constructed supplies the first input terminal of the adder ADD with the result of the operation on the data in the first row of the image matrix X defined by the formula (1) in the right side of the formula (5) and the data of the five terms relating to the first row of the filter factor matrix Ws defined by the formula (4). The above operation uses the multiplication factors W11, W13, W12, W11, W13 and W12 to be written into the multipliers M1 through M6, respectively, the sign data to be written into the adder-subtracters AS1 through AS4, and the consecutive image data X11, X12, X13, X14 and X15. As has been described previously, the processing circuit 11 includes two systems. Therefore, the spacial filter image process for the image data X11 through X15 provides the filtered output at increased speeds.

Each of the processing circuits 12 through 15 is constructed and operate in the same way as the processing circuit 11.

The processing circuit 12 is previously supplied with multiplication factors W21, W23, W22, W21, W23 and W22, and data relating to the sign to be written into adder-subtracters corresponding to the adder-subtracters AS1 through AS4. These multiplication factors are supplied from the CPU 20. The processing circuit 12 is also supplied with image data X21, X22, X23, X24 and X25, which are input at the time of spacial filter image processing. Then the processing circuit 12 outputs to a second input terminal of the adder ADD the result of the operation on data in the second row of the image matrix X defined in the formula (1) included in the right side of the formula (5) and data of five terms relating to the second row of the filter factor matrix Ws defined by the formula (4).

The processing circuit 13 is supplied beforehand by the CPU 20 with multiplication factors W31, W33, W32, W31, W33 and W32, and data relating to the sign to be written into adder-subtracters corresponding to the adder-subtracters AS1 through AS4. The processing circuit 13 is also supplied with image data X31, X32, X33, X34 and X35, Which are input at the time of spacial filter image processing. Then the processing circuit 12 outputs to a third input terminal of the adder ADD the result of the operation on data in the third row of the image matrix X defined in the formula (1) included in the right side of the formula (5) and data of five terms relating to the third row of the filter factor matrix Ws defined by the formula (4).

The processing circuit 14 is supplied beforehand by the CPU 20 with multiplication factors W41, W43, W42, W41, W43 and W42, and data relating to the sign to be written into adder-subtracters corresponding to the adder-subtracters AS1 through AS4. The processing circuit 12 is also supplied with image data X41, X42, X43, X44 and X45, which are input at the time of spacial filter image processing. Then the processing circuit 14 outputs to a fourth input terminal of the adder ADD the result of the operation on data in the fourth row of the image matrix X defined in the formula (1) included in the right side of the formula (5) and data of five terms relating to the fourth row of the filter factor matrix Ws defined by the formula (4).

The processing circuit 15 is supplied beforehand by the CPU 20 with multiplication factors W51, W53, W52, W51, W53 and W52, and data relating to the sign to be written into adder-subtracters corresponding to the adder-subtracters AS1 through AS4. The processing circuit 15 is also supplied with image data X51, X52, X53, X54 and X55, which are input at the time of spacial filter image processing. Then the processing circuit 12 outputs to a third input terminal of the adder ADD the result of the operation on data in the fifth row of the image matrix X defined in the formula (1) included in the right side of the formula (5) and data of five terms relating to the fifth row of the filter factor matrix Ws defined by the formula (4).

The adder ADD adds the data applied to the first to fifth input terminals thereof, and generates data of the operation result FWs. When a plurality of image matrixes X are successively input to the spacial filter image processing device in order, the operation results FWs are made available at the output terminal of the adder ADD with the period of the clock signal CK.

According to the aforementioned embodiment, the data of the image matrix X is distributed to the systems, each of which separately subjects the distributed data to the spacial filter image process. Additionally, the number of registers between the input and output of each processing circuit is 4. As a result, it takes four times the period of the clock signal CK to obtain the result of the operation (finite impulse response processing) on the data supplied through the registers D4 and D14. The operation result of the spacial filter image process is made available by simply adding the operation results supplied from the processing circuits 11 through 15. As a result, it is possible to execute an operation with twice the period of the clock signal CK per one datum. Therefore, according to the present embodiment, it is possible to reduce the processing time to two-fifths of the processing time of the aforementioned conventional device where the operation is carried out with five times the period of the clock signal CK.

Figure 4B:
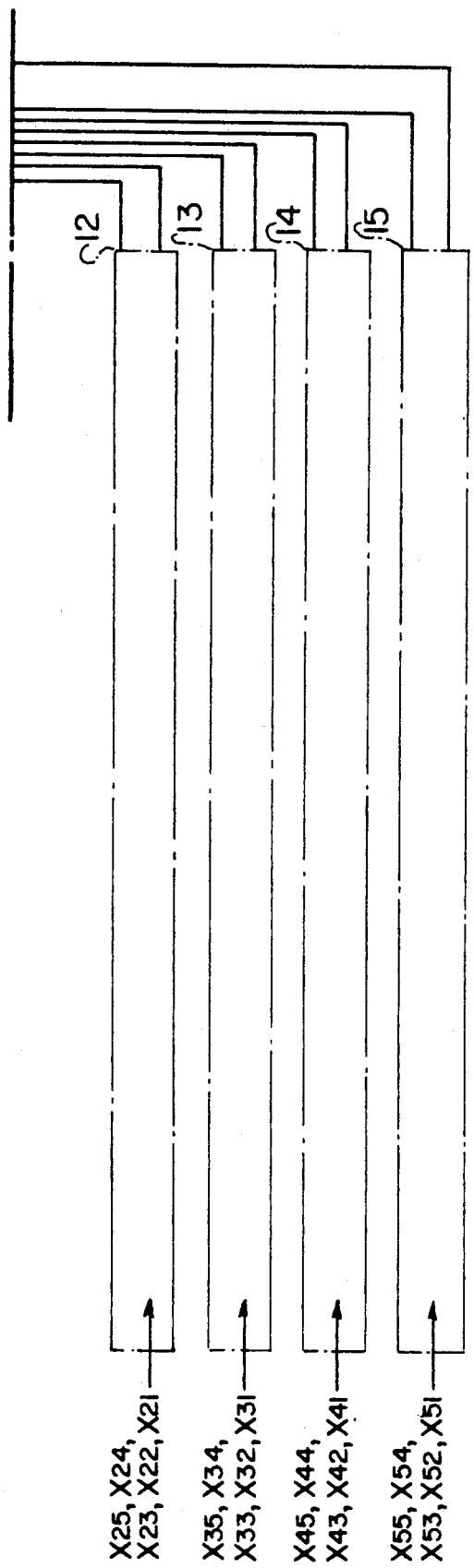

A variation of the above-mentioned embodiment is illustrated in FIGS. 4A and 4B, in which those parts which are the same as those in FIGS. 2A and 2B are given the same references. Referring to FIGS. 4A and 4B, the data output from the register D4 in the processing circuit 11 is supplied to a first input terminal of an adder ADD1. Similarly, the data output from the registers D4 in the processing circuits 12 through 15 are supplied to second to fifth input terminals of the adder ADD1. The output data of the register D14 in the processing circuit 11 is supplied to a first terminal of an adder ADD2. Similarly, the output data of the registers D14 in the processing circuits 12 through 15 are supplied to second to fifth input terminals of the adder ADD2. The addition results of the adders ADD1 and ADD2, which are the data FWs, are supplied to (a) and (b) input terminals of a switch SW1, which is alternately switchable therebetween in synchronism with the clock signal CK1.

In the above-mentioned embodiment and the variation thereof, the image data train is divided into two systems. In an alternative embodiment, it is possible to divide the image data train into more than two systems.

Figure 5B:
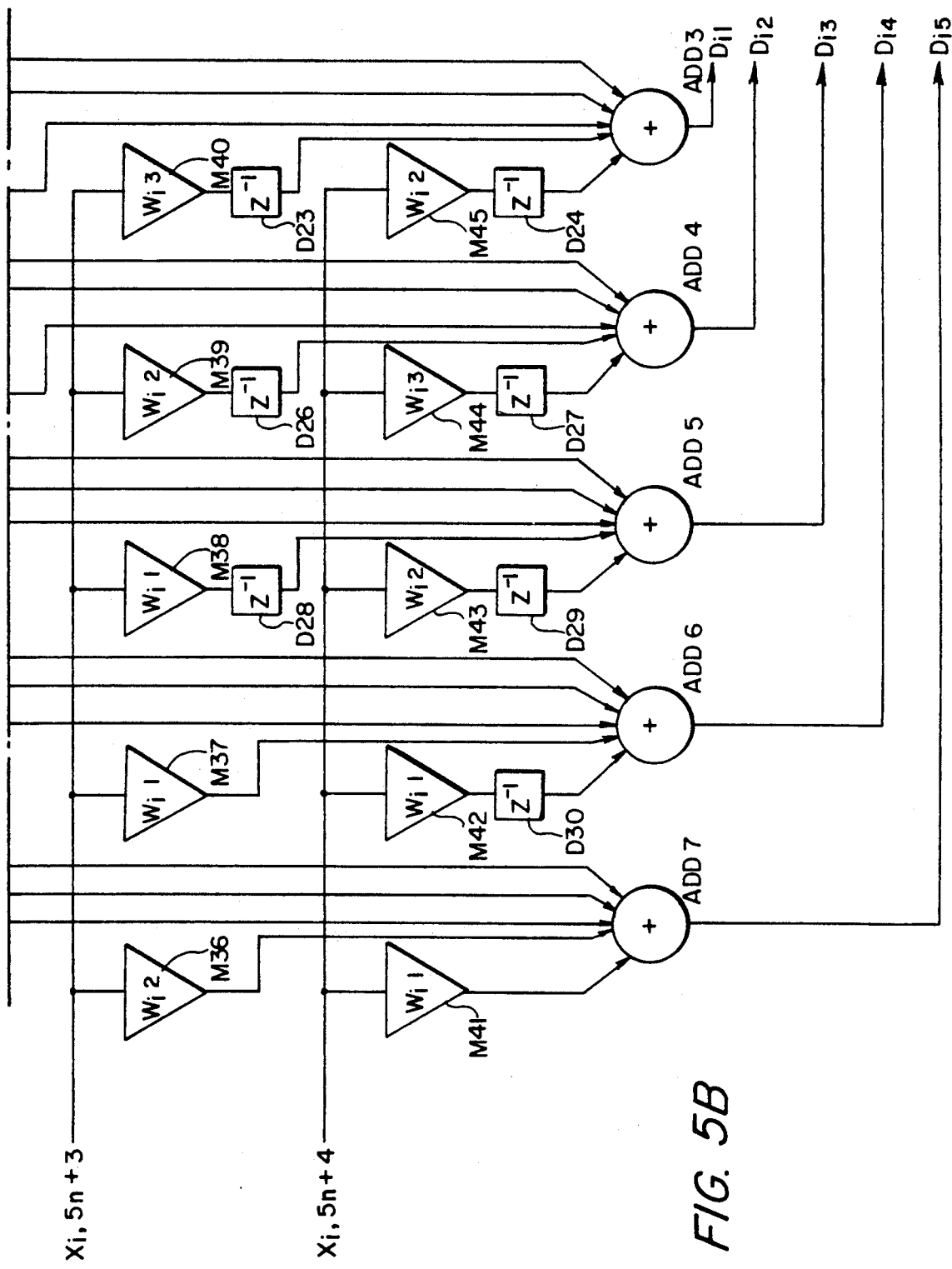

FIGS. 5A and 5B illustrate an essential part of another preferred embodiment of the present invention. The illustrated circuit is a sum-of-products circuit with respect to the i-th row in the case where the input data train is distributed to 5 circuit systems. Image data $X_{i,5n}$ is supplied to multipliers M21 through M25, and image data $X_{i,5n+1}$ is supplied to multipliers M26 through M30. Image data $X_{i,5n+2}$ is supplied to multipliers M31 through M35, and image data $M_{i,5n+3}$ is supplied to multipliers M36 through M40. Image data $M_{i,5n+4}$ is supplied to multipliers M41 through M45. The multipliers M21 through M45 are supplied to corresponding illustrated multiplication factors. For example, the multipliers M21 through M25 are supplied with multiplication factors $W_{i1}$, $W_{i2}$, $W_{i3}$, $W_{i2}$ and $W_{i1}$, respectively.

Output signals of the multipliers M21 through M25 are supplied to first input terminals of adders ADD7 through ADD3, respectively. Each of the adders ADD3 through ADD7 has the first through fifth input terminals. Output signals of the multipliers M26 through M29 are supplied to the second input terminals of the adders ADD7 through ADD4, respectively. The output signal of the multiplier M30 is supplied to the second input terminal of the adder ADD3 through a register D21. The output signals of the multipliers M31 through M33 are supplied to the third input terminals of the adders ADD7 through ADD5, respectively. The output signals of the multipliers M34 and M35 are supplied to the second input terminals of the adders ADD4 and ADD3 through registers D25 and D22, respectively. The output signals of the multipliers M36 and M37 are supplied to the fourth input terminals of the adders ADD7 and ADD6, respectively. The output signals of the multipliers M38, M39 and M40 are supplied to the third input terminals of the adders ADD5, ADD4 and ADD3 through registers D28, D26 and D23, respectively. The output signal of the multiplier M41 is supplied to the fifth input terminal of the adder ADD7. The output signals of the multipliers M42 through M45 are supplied to the fifth input terminals of the adders ADD6 through ADD3 through registers D30, D29, D27 and D24, respectively.

When the output signals of the adders ADD3 through ADD7 are represented as Di1 through Di5, respectively, the operation results FW1 through FW5 are described as follows:

$$FW1 = D14 + D24 + D34 + D44 + D45$$

$$FW3 = D11 + D21 + D31 + D41 + D51$$

$$FW4 = D12 + D22 + D32 + D42 + D52$$

$$FW5 = D13 + D23 + D33 + D43 + D53$$

The embodiment shown in FIG. 5 presents the same advantage as the first embodiment.

The present invention is not limited to the above-mentioned embodiments, and variations and modifications may be made without departing from the scope of the present invention.

What is claimed is:

1. A digital filter processor comprising:
    input means for distributing an input digital data train including a plurality of digital data to a plurality of systems, each of said systems being provided with a corresponding one of the distributed data trains at the same time;
    each of said systems including operation means for multiplying each digital data included in said corresponding one of the distributed data trains by a corresponding multiplication factor at the same time to thereby generate multiplied data and for generating a sum signal indicative of a sum total of said multiplied data related to said corresponding one of the distributed data trains, each of said systems outputting said sum signal at the same time;
    selection means for selecting one of the sum signals supplied from said operation means provided for said plurality of systems and for outputting an output digital signal; and
    clock signal generating means for generating a first clock signal CK and a second clock signal CK1, said input digital data train being supplied to said input means in synchronism with said second clock signal CK1, said selection means being controlled by said second clock signal CK1, and said operation means operating in synchronism with said first clock CK.

2. A digital filter processor as claimed in claim 1, wherein said selection means selects the sum signals supplied from said operation means one by one in a predetermined order.

3. A digital filter processor as claimed in claim 3, wherein the period of said second clock signal CK1 is shorter than the period of said first clock signal CK.

4. A digital filter processor as claimed in claim 3, wherein when said digital filter processor has m systems (m is an arbitrary integer), said second clock signal CK1 is m times faster than said first clock signal CK.

5. A digital filter processor as claimed in claim 1, wherein said input digital data train is data relating to a row of a data matrix.

6. A digital filter processor as claimed in claim 1, wherein said digital data included in said input digital data train is part of n x n image data (n is an arbitrary integer) which represent data relating to one pixel.

7. A digital filter processor as claimed in claim 1, wherein said input means comprises flip-flops connected to the corresponding systems.

8. A digital filter processor as claimed in claim 7, wherein each of said flip-flops connected to said plurality of systems enters said digital data at the same time.

9. A digital filter processor as claimed in claim 1, wherein said operation means comprises registers and adders.

10. A digital filter processor as claimed in claim 1, wherein said digital filter processor comprises two systems.

11. A digital filter processor as claimed in claim 1, wherein:
    said input digital data train includes five data, and said digital filter processor has first and second systems,
    said operation means included in said first system comprises first to third multipliers each having first and second input terminals and an output terminal, first to sixth registers each serving as a unit delay element, first and second adders each having first and second input terminals and an output terminal, and first and second adder-subtracters each having first and second input terminals and an output terminal,
    said operation means included in said second system comprises fourth to sixth multipliers, seventh to thirteenth registers each serving as a unit delay element, third and fourth adders each having first and second input terminals and an output terminal, and third and fourth adder-subtracters each having first and second input terminals and an output terminal,
    said first multiplier is connected to the first input terminal of said first adder and the first input terminal of said first adder-subtracter through said first register, said second multiplier is connected to the second terminal of said first adder-subtracter, and said third multiplier is connected to the first input terminal of the second adder-subtracter and to the second input terminal of the second adder-subtracter through the fifth register, the sixth register connected to the output terminal of the second adder-subtracter,
    the output terminal of said first adder-subtracter is coupled to the second input terminal of said first adder through said second register, the output terminal of the first adder is coupled to the first input terminal of the second adder through the third register, and the output terminal of the second adder is connected to the fourth register, the fourth multiplier is connected to the first input terminal of the third adder and the first input terminal of the third adder-subtracter through the seventh register, and the fifth multiplier is connected to the second input terminal of the third adder-subtracter, the sixth multiplier being connected to the first input terminal of the fourth adder-subtracter and to the second input terminal of the fourth adder-subtracter through the eleventh register, the output terminal of the third adder-subtracter is coupled to the second input terminal of the third adder through the eighth register, and the output terminal of the third adder is coupled to the second input terminal of the fourth adder through the eighth register, the first input terminal of the fourth adder being connected to the sixth register, the output signal of the fourth adder is connected to the tenth register, and the output terminal of the fourth adder-subtracter is coupled to the second input terminal of the second adder through the twelfth and thirteenth registers, and the fourth register and the tenth register are connected to the selection means.

12. A digital filter processor as claimed in claim 11, wherein said selection means has a switch having first and second input terminals, and an output terminal, and wherein the first and second input terminals of said switch are connected to the fourth and tenth registers, respectively, and said output digital signal is drawn from the output terminal of said switch.

13. A digital filter processor as claimed in claim 11, wherein said switch alternately selects one of the signal trains supplied from the fourth and tenth registers.

14. A digital filter processor as claimed in claim 13, wherein said input means comprises:
a first flip-flop connected to the first to third multipliers, and
a second flip-flop connected to the fourth to sixth multipliers,
wherein said first flip-flop, said second flip-flop and said switch operate at the same time.

15. A digital filter processor as claimed in claim 11, wherein said first through sixth multipliers have corresponding multiplication factors.

16. A digital filter processor as claimed in claim 11, wherein each of said first to fourth adder-subtracters carries out addition or subtraction.

17. A digital filter processor for carrying out spacial filter image processing with respect to an image matrix X including image data Xij arranged in n rows and n columns (n is an arbitrary integer), by using a filter factor matrix Wij which consists of factors Wij arranged in n rows and n columns where factors relating to columns other than the $((n+1)/2)$-th column are symmetrical with respect to the $((n+1)/2)$-th column, said digital filter processor comprising:
a plurality of processing circuits each receiving image data amounting to one row of said image matrix and outputting a first partial sum signal, and adder means for adding said first partial sum signals supplied from the plurality of processing circuits, thereby outputting a filtered image signal, each of said processing circuits including:
(a) input means for distributing said image data Xij supplied for every row to m systems (m is an arbitrary integer), each of said systems including operation means for multiplying the distributed image data Xij by the corresponding factors Wij and for generating a second partial sum signal indicative of a sum total of all the multiplied data relating to the corresponding system; and
(b) selection means for selecting one of the second partial sum signals supplied from said operation means provided for each of said systems, the selected one of the second partial sum signals being supplied, as one of said first partial sum signals, to said adder means; and
clock signal generating means for generating a first clock signal CK and a second clock signal CK1, said image data relating to one row being supplied to said input means in synchronism with said second clock signal CK1, said selection means being controlled by said second clock signal CK1, and said operation means operating in synchronism with said first clock signal CK.

18. A digital filter processor as claimed in claim 17, wherein the period of said second clock signal CK1 is shorter than the period of said first clock signal CK.

19. A digital filter processor as claimed in claim 18, wherein said second clock signal CK1 is m times faster than said first clock signal CK.

20. A digital filter processor as claimed in claim 17, wherein said input means comprises a flip-flop provided for each of the systems.

21. A digital filter processor as claimed in claim 20, wherein each of said flip-flops provided for said plurality of systems enters said image data at the same time.

22. A digital filter processor as claimed in claim 17, wherein said operation means comprises registers and adders.

23. A digital filter processor as claimed in claim 17, wherein:
said image data Xij includes five data amounting to one line, and said digital filter processor includes five processing circuits each including first and second systems (m=2);
said operation means included in said first system comprises first to third multipliers each having first and second input terminals and an output terminal, first to sixth registers each serving first and second input terminals and an output terminal, and first and second adder-subtracters each having first and second input terminals and an output terminal;
said operation means included in said second system comprises fourth to sixth multipliers, seventh to twelfth registers each serving as a unit delay element, third and fourth adders each having first and second input terminals and an output terminal, and third and fourth adder-subtracters each having first and second input terminals and an output terminal,
said first multiplier is connected to the first input terminal of said first adder and the first input terminal of said first adder-subtracter through said first register, said second multiplier is connected to the second terminal of said first adder-subtracter, and said third multiplier is connected to the first input terminal of the second adder-subtracter and to the second input terminal of the second adder-subtracter through the fifth register, the sixth register connected to the output terminal of the second adder-subtracter;
the output terminal of said first adder-subtracter is coupled to the second input terminal of said first adder through said second register, the output terminal of the first adder is coupled to the first input terminal of the second adder through the third register, and the output terminal of the second adder is connected to the fourth register;

the fourth multiplier is connected to the first input terminal of the third adder and the first input terminal of the third adder-subtracter through the seventh register, and the fifth multiplier is connected to the second input terminal of the third adder-subtracter, the sixth multiplier being connected to the first input terminal of the fourth adder-subtracter and to the second input terminal of the fourth adder-subtracter through the eleventh register, the output terminal of the third adder-subtracter is coupled to the second input terminal of the third adder through the eighth register, and the output terminal of the third adder is coupled to the second input terminal of the fourth adder through the eighth register, the first input terminal of the fourth adder being connected to the sixth register, the output signal of the fourth adder is connected to the tenth register, and the output terminal of the fourth adder-subtracter is coupled to the second input terminal of the second adder through the twelfth and thirteenth registers; and the fourth register and the tenth register of each processing circuit are connected to the selection means of the same processing circuit.

24. A digital filter processor as claimed in claim 23, wherein said selection means has a switch having first and second input terminals, and an output terminal, and wherein the first and second input terminals of said switch are connected to the fourth and tenth registers, respectively, and the output terminal of said switch is connected to said adder means.

25. A digital filter processor as claimed in claim 24, wherein said input means comprises:

a first flip-flop connected to the first to third multipliers, and a second flip-flop connected to the fourth to sixth multipliers, wherein said first flip-flop, said second flip-flop and said switch operate at the same time.

26. A digital filter processor as claimed in claim 23, wherein said switch alternately selects said second partial sum signals supplied from the fourth and tenth registers.

27. A digital filter processor as claimed in claim 23, wherein said first through sixth multipliers are provided with corresponding factors.

28. A digital filter processor as claimed in claim 23, wherein each of said first to fourth adder-subtracters carries out addition or subtraction.

29. A digital filter processor for carrying out spacial filter image processing with respect to an image matrix X including image data Xij arranged in n rows and n columns (n is arbitrary integer), by using a filter factor matrix Wij which consists of factors Wij arranged in n rows and n columns where factors relating to columns other than the ((n+2)/2)-th column are symmetrical with respect to the ((n+1)/2)-th column, said digital filter processor comprising:

(a) a plurality of processing circuits each receiving image data Xij amounting to one row and outputting m partial sum signals, each of said processing circuits including input means for distributing said image data Xij supplied for every row to m systems (m is an arbitrary integer), each of said systems including operation means for multiplying the distributed image data Xij by the corresponding factors Wij and for generating one of said m partial sum signals indicative of a sum total of all the multiplied data relating to the corresponding system;

(b) adder means for separately adding said partial sum signals relating to the corresponding systems in each of the plurality of processing circuits, thereby generating m addition results;

(c) selection means for selecting one of the m addition results supplied from said adder means and for generating a filtered image data which has been subjected to said spacial filter image processing; and (d) clock signal generating means for generating a first clock signal CK and a second clock signal CK1, said image data relating to one row being supplied to said input means in synchronism with said second clock signal CK1, said selection means being controlled by said second clock signal CK1, and said operation means operating in synchronism with said first clock signal CK.

30. A digital filter processor as claimed in claim 29, wherein:

said image data Xi; includes five data amounting to one line, and said digital filter processor includes five processing circuits each including first and second systems (m=2);

said operation means included in said first system comprises first to third multipliers each having first and second input terminals and an output terminal, first to sixth registers each serving as a unit delay element, first and second adders each having first and second input terminals and an output terminal, and first and second adder-subtracters each having first and second input terminals and an output terminal;

said operation means included in said second system comprises fourth to sixth multipliers, seventh to thirteenth registers, third and fourth adders each having first and second input terminals and an output terminal, and third and fourth adder-subtracters each having first and second input terminals and an output terminal;

said first multiplier is connected to the first input terminal of said first adder and the first input terminal of said first adder-subtracter through said first register, said second multiplier is connected to the second terminal of said first adder-subtracter, and said third multiplier is connected to the first input terminal of the second adder-subtracter and to the second input terminal of the second adder-subtracter through the fifth register, the sixth register connected to the output terminal of the second adder-subtracter;

the output terminal of said first adder-subtracter is coupled to the second input terminal of said first adder through said second register, the output terminal of the first adder is coupled to the first input terminal of the second adder through the third register, and the output terminal of the second adder is connected to the fourth register;

the fourth multiplier is connected to the first input terminal of the third adder and the first input terminal of the third adder-subtracter through the seventh register, the fifth multiplier is connected to the second input terminal of the third adder-subtracter, and the sixth multiplier is connected to the first input terminal of the fourth adder-subtracter and to the second input terminal of the fourth adder-subtracter through the eleventh register;

the output terminal of the third adder-subtracter is coupled to the second input terminal of the third adder through the eighth register, and the output terminal of the third adder is coupled to the second input terminal of the fourth adder, the first input terminal of which is connected to the sixth register;

the output signal of the fourth adder is connected to the tenth register, and the output terminal of the fourth adder-subtracter is coupled to the second input terminal of the second adder through the twelfth and thirteenth registers; and the fourth register and the tenth register are connected to the adder means.

31. A digital filter processor as claimed in claim 30, wherein said adder means comprises first and second adders, wherein said first adder is supplied with the m partial sum signals supplied from the first systems included in said first to fifth processing circuits, thereby outputting a first result, and said second adder is supplied with the m partial sum signals supplied from the second systems of said first to fifth processing circuits, thereby outputting a second result, and wherein said first and second results are supplied to said selection means.

32. A digital filter processor as claimed in claim 31, wherein said selection means comprises a switch having a first input terminal supplied with said first result, and a second input terminal supplied with said second result, and said switch outputs said filtered image data.

33. A digital filter processor as claimed in claim 32, wherein said input means provided in each of said processing circuits comprises first and second flip-flops, and wherein said first flip-flop is connected to said first system, and said second flip-flop is connected to said second system.

34. A digital filter processor as claimed in claim 33, wherein said first flip-flop, said second flip-flop and said switch operate in synchronism with each other.

* * * * *